(12) United States Patent
Goto et al.

(10) Patent No.: US 9,595,967 B2
(45) Date of Patent: Mar. 14, 2017

(54) LEVEL SHIFT CIRCUIT AND DRIVER CIRCUIT

(71) Applicant: Kabushiki Kaisha Toshiba, Minato-ku, Tokyo (JP)

(72) Inventors: Yuichi Goto, Hiratsuka Kanagawa (JP); Fumihiro Nakamichi, Yokohama Kanagawa (JP); Kei Kasai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/847,871

(22) Filed: Sep. 8, 2015

(65) Prior Publication Data

US 2016/0248404 A1 Aug. 25, 2016

(30) Foreign Application Priority Data

Feb. 20, 2015 (JP) ................. 2015-032152

(51) Int. Cl.
*H03K 19/0185* (2006.01)
*H03K 19/0175* (2006.01)

(52) U.S. Cl.
CPC ........... *H03K 19/018528* (2013.01); *H03K 19/017509* (2013.01); *H03K 19/018514* (2013.01)

(58) Field of Classification Search
CPC ....... H03K 19/0175; H03K 19/017509; H03K 19/0185; H03K 19/018507; H03K 19/018514; H03K 19/018521; H03K 19/018528
USPC .......... 326/62, 80, 81, 82, 83; 327/108, 109, 327/110, 111, 333
See application file for complete search history.

(56) References Cited

U.S. PATENT DOCUMENTS

| | | | |
|---|---|---|---|
| 7,227,400 B1 * | 6/2007 | Gillespie ......... | H03K 19/00315 327/333 |
| 7,236,015 B2 | 6/2007 | Eberlein | |
| 9,191,007 B1 * | 11/2015 | Choy ............... | H03K 3/356113 |
| 2007/0188194 A1 * | 8/2007 | Yang ................ | H03K 19/01852 326/80 |
| 2012/0068755 A1 * | 3/2012 | Yamamoto ....... | H03K 3/356113 327/333 |

(Continued)

FOREIGN PATENT DOCUMENTS

| | | |
|---|---|---|
| JP | 2003-101402 A | 4/2003 |
| JP | 2005-020392 A | 1/2005 |

(Continued)

*Primary Examiner* — William Hernandez
(74) *Attorney, Agent, or Firm* — White & Case LLP

(57) ABSTRACT

According to one embodiment, a level shift circuit includes first through fourth transistors, a control circuit, and first and second generating circuits. The control circuit outputs a first voltage obtained by level-shifting an input voltage to a first terminal. The first transistor supplies a first electric current to the control circuit for outputting the first voltage to the first terminal. The second transistor increases the first electric current. The first generating circuit generates a first pulse signal for controlling the second transistor. The third transistor supplies a second electric current to the first terminal for generating a second voltage corresponding to a first supply of a low-potential side. The fourth transistor increases the second electric current. The second generating circuit generates a second pulse signal for controlling the fourth transistor.

17 Claims, 10 Drawing Sheets

(56) References Cited

U.S. PATENT DOCUMENTS

2014/0320180 A1   10/2014   Akahane

FOREIGN PATENT DOCUMENTS

| JP | 2010-103971 A | 5/2010 |
| JP | 2011-049741 A | 3/2011 |
| JP | 2013-115601 A | 6/2013 |

* cited by examiner

1

LEVEL SHIFT CIRCUIT AND DRIVER CIRCUIT

CROSS REFERENCE TO RELATED APPLICATIONS

This application is based upon and claims the benefit of priority from the prior Japanese Patent Application No. 2015-032152, filed on Feb. 20, 2015, the entire contents of which are incorporated herein by reference.

FIELD

Embodiments described herein relate generally to a level shift circuit and a driver circuit.

BACKGROUND

A semiconductor device having a plurality of power supplies may be provided with a level shift circuit which shifts a signal level between different high-potential side power sources.

The problems of directly driving an output element by the level shift circuit are the increase of power consumption due to the necessity of a large number of bias currents and a low operating speed. Thus, a buffer circuit is generally provided as a high-side driver circuit.

However, the circuit configuration becomes complex and the chip cost rises by the buffer circuit.

DETAILED DESCRIPTION

According to one embodiment, a level shift circuit includes first through fourth transistors, a control circuit, and first and second generating circuits. The control circuit outputs a first voltage obtained by level-shifting an input voltage to a first terminal. The first transistor supplies a first electric current to the control circuit for outputting the first voltage to the first terminal. The second transistor increases the first electric current. The first generating circuit generates a first pulse signal for controlling the second transistor. The third transistor supplies a second electric current to the first terminal for generating a second voltage corresponding to a first supply of a low-potential side. The fourth transistor increases the second electric current. The second generating circuit generates a second pulse signal for controlling the fourth transistor.

Embodiments will now be explained with reference to the accompanying drawings. Like components are provided with like reference signs throughout the drawings and repeated descriptions thereof are appropriately omitted.

In a driver circuit described below by way of example, an output high-side element is configured by a P-channel type metal-insulator-semiconductor field-effect transistor (MISFET) (hereinafter, briefly referred to as a "Pch MIS transistor"), and an output low-side element is configured by an N-channel type MISFET (hereinafter, briefly referred to as an "Nch MIS transistor"), and this driver circuit is applied to a high breakdown voltage output switch which requires a level shift.

Such a driver circuit can be used, for example, as a gate driver IC of a semiconductor switching element or an output circuit of a DC-DC converter IC which requires high-speed response, low power consumption, and low costs. However, the driver circuit is not limited to such purposes, and is also widely applicable to semiconductor devices used in consumer equipment and industrial equipment.

(1) Embodiment 1

Figure 1:
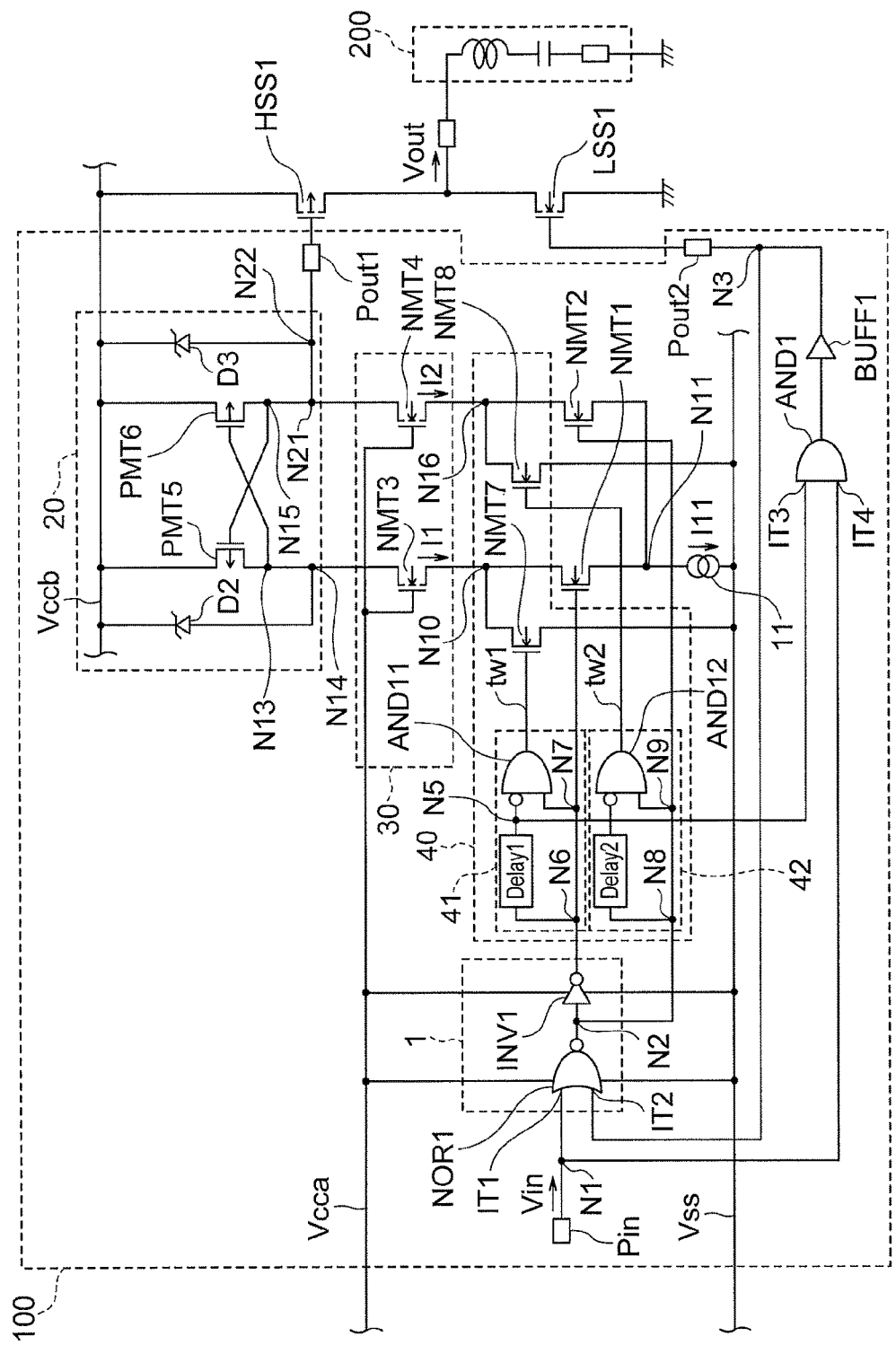
FIG. 1 is an example of a circuit diagram showing a schematic configuration of a driver circuit according to Embodiment 1.

FIG. 1 is an example of a circuit diagram showing a schematic configuration of an output switching element drive circuit which includes a level shift circuit according to Embodiment 1. As shown in FIG. 1, the output switching element drive circuit according to the present embodiment includes a level shift circuit 100, a high-side switching element HSS1, and a low-side switching element LSS1.

The high-side switching element HSS1 is configured by a Pch MIS transistor having its source connected to a high-potential side power supply Vccb, its drain connected to an output terminal Vout, and its gate connected to a high-side output Pout1.

In the present embodiment, the low-side switching element LSS1 is configured by an Nch MIS transistor having its source connected to a low-potential side power supply (ground potential) Vss, its drain connected to an output terminal Vout, and its gate connected to a low-side output Pout2.

A load 200 is connected to the output Vout of the output switching element drive circuit. The load 200 includes, for example, a coil, a condenser, and a resistance.

The level shift circuit 100 includes a control unit 1, a gate control circuit 20, a source follower circuit 30, a drive current increasing circuit 40 which is characteristic in the present embodiment, a constant current source 11, Nch MIS transistors NMT1 and NMT2, an AND circuit AND1, and a buffer BUFF1.

The level shift circuit 100 is supplied with a high-potential side power supply Vcca and a high-potential side power supply Vccb which is higher in voltage than the high-potential side power supply Vcca. A voltage (hereinafter, briefly referred to as an "input voltage") Vin is inputted to the level shift circuit 100 via an input terminal Pin. The level shift circuit 100 steps up the input voltage Vin and then outputs a level-shifted output voltage to the terminal Pout (output terminal) 1.

The control unit 1 includes a NOR circuit NOR1 and an inverter INV1.

The NOR circuit NOR1 is provided between a node N1 and a node N2, and is supplied with the high-potential side power supply Vcca and the low-potential side power supply (ground potential) Vss. The input voltage Vin is inputted to one input terminal IT1 of the NOR circuit NOR1. The other input terminal IT2 is connected to a node N3 so that an output voltage (a gate voltage of the low-side switching element LSS1) of the buffer BUFF1 is inputted. The NOR circuit NOR1 outputs the non-disjunction of the input voltage Vin and the output voltage of the buffer BUFF1. In the present embodiment, the low-potential side power supply Vss corresponds to, for example, a reference node.

The inverter INV1 is provided between the node N2 and the drive current increasing circuit 40, and is supplied with the high-potential side power supply Vcca and the low-potential side power supply (ground potential) Vss. An output voltage of the NOR circuit NOR1 is inputted to the inverter INV1, and the inverter INV1 outputs a signal having a phase reverse to the output voltage.

The drive current increasing circuit 40 includes a pulse signal generating circuits 41 and 42, and Nch MIS transistors NMT7 and NMT8.

The pulse signal generating circuit 41 has a delay circuit Delay1 and an AND circuit AND11.

The delay circuit Delay1 has an input terminal connected to a node N6, and an output terminal connected to a node N5. An output signal INV1_out of the inverter INV1 is inputted to the delay circuit Delay1, and the delay circuit Delay1 outputs, to the node N5, a signal which is obtained by delaying a rise signal of the output signal INV1_out by a predetermined period.

The AND circuit AND11 has an inverting input terminal connected to the node N5, a noninverting input terminal connected to a node N7, and an output terminal connected to the gate of the Nch MIS transistor NMT7. A delay signal outputted from the delay circuit Delay1 is inputted to the AND circuit AND11 from the noninverting input terminal, and an output signal of the inverter INV1 is inputted to the noninverting input terminal. The AND circuit AND11 outputs a conjunction of these signals to the gate of the Nch MIS transistor NMT7 as a pulse signal tw1.

The Nch MIS transistor NMT7 corresponds to, for example, a second transistor in the present embodiment, and has its drain connected to a node N10 and its source connected to the low-potential side power supply (ground potential) Vss.

The pulse signal generating circuit 42 has a delay circuit Delay2 and an AND circuit AND12.

The AND circuit AND12 has a noninverting input terminal connected to a node N9, an inverting input terminal connected to the output terminal of the delay circuit Delay2, and an output terminal connected to the gate of the Nch MIS transistor NMT8.

The Nch MIS transistor NMT8 corresponds to, for example, a fourth transistor in the present embodiment, and has its drain connected to a node N16, its source connected to the low-potential side power supply (ground potential) Vss, and its gate connected to the output terminal of the AND circuit AND12.

The delay circuit Delay2 has an input terminal connected to a node N8, and an output terminal connected to the inverting input of the AND circuit AND12. An output signal NOR1_out of the NOR circuit NOR1 is inputted to the delay circuit Delay2, and the delay circuit Delay2 outputs, to the noninverting input terminal of the AND circuit AND12, a signal which is obtained by delaying a rise signal of the output signal NOR1_out by a predetermined period.

The AND circuit AND12 has an inverting input terminal connected to the output terminal of the delay circuit Delay1, and a noninverting input terminal connected to the node N9. A delay signal outputted from the delay circuit Delay1 is inputted to the AND circuit AND12 from the inverting input terminal, and an output signal of the NOR circuit NOR1 is inputted to the noninverting input terminal. The AND circuit AND12 outputs a conjunction of the inverted delay signal and the output signal of the NOR circuit NOR1, to the gate of the Nch MIS transistor NMT8.

The gate control circuit 20 includes a Pch MIS transistor PMT5, a Pch MIS transistor PMT6, and Zener diodes D2 and D3.

The Pch MIS transistor PMT5 has its source connected to the high-potential side power supply Vccb, its gate connected to a node N15, and its drain connected to a node N14. The Pch MIS transistor PMT6 has its source connected to the high-potential side power supply Vccb, its gate connected to a node N13, and its drain connected to the node N15.

The Zener diode D2 has a breakdown voltage less than or equal to the gate breakdown voltage of the high-side switching element HSS1, for example, a breakdown voltage of 5 V, and has its cathode connected to the high-potential side power supply Vccb and its anode connected to the node N14. The Zener diode D3 has its cathode connected to the high-potential side power supply Vccb and its anode connected to a node N22.

The source follower circuit 30 includes an Nch MIS transistor NMT3 and an Nch MIS transistor NMT4. The Nch MIS transistor NMT3 corresponds to, for example, a first transistor in the present embodiment, and has its drain connected to the drain of the Pch MIS transistor PMT5 via the node N14, its gate connected to the high-potential side power supply Vcca, and its source connected to the node N10. The Nch MIS transistor NMT3 passes an electric current I1 to the low-potential side power supply (ground potential) Vss from the gate of the Pch MIS transistor PMT6 when the high-side switching element HSS1 is off. The electric current I1 corresponds to, for example, a second electric current in the present embodiment.

The Nch MIS transistor NMT4 corresponds to, for example, a third transistor in the present embodiment, and has its drain connected to the drain of the Pch MIS transistor PMT6 via a node N21, its gate connected to the high-potential side power supply Vcca, and its source connected to the node N16. The Nch MIS transistor NMT4 passes an electric current (hereinafter referred to as an "HSS1 drive current") I2 for driving the high-side switching element HSS1 to the low-potential side power supply (ground potential) Vss from the gate of the high-side switching element HSS1 when the high-side switching element HSS1 is on. The electric current I2 corresponds to, for example, a first electric current in the present embodiment.

The Nch MIS transistor NMT4 outputs, from its drain, a voltage which has been level-shifted by stepping up the input voltage Vin, and outputs the voltage to the high-side output Pout1 via the node N21.

The Nch MIS transistor NMT1 has its drain connected to the node N10, its source connected to the constant current source 11 via a node N11, and its gate connected to the output terminal of the inverter INV1 via the nodes N7 and N6 so that an output voltage of the inverter INV1 is inputted to the Nch MIS transistor NMT1. The Nch MIS transistor NMT2 has its drain connected to the node N16, its source connected to the constant current source 11 via the node N11, and its gate connected to the node N2 so that an output voltage of the NOR circuit NOR1 is inputted to the Nch MIS transistor NMT2.

The constant current source 11 has one end connected to the source of the Nch MIS transistor NMT1 and the source of the Nch MIS transistor NMT2 via the node N11, and the other end connected to the low-potential side power supply (ground potential) Vss. The constant current source 11 passes a constant electric current I11 to the low-potential side power supply (ground potential) Vss from each of the sources of the Nch MIS transistors NMT1 and NMT2.

The AND circuit AND1 has a first input terminal IT3 connected to the node N5, a second input terminal IT4 connected to the node N1, and its output terminal connected to the input terminal of the buffer BUFF1. The AND circuit AND1 outputs a conjunction of the input voltage Vin and the output voltage of the delay circuit Delay1 to the buffer BUFF1. The buffer BUFF1 has its input terminal connected to the output terminal of the AND circuit AND1 and its output terminal connected to the gate of the low-side switching element LSS1. The buffer BUFF1 generates a drive current on the basis of the output voltage of the AND circuit AND1 and then outputs the drive current from the low-side output Pout2. The drive voltage from the buffer BUFF1 is also inputted to the input terminal IT2 of the NOR circuit NOR1 via the node N3. In the present embodiment, the drive voltage from the buffer BUFF1 corresponds to, for example, a third signal.

Figure 2:
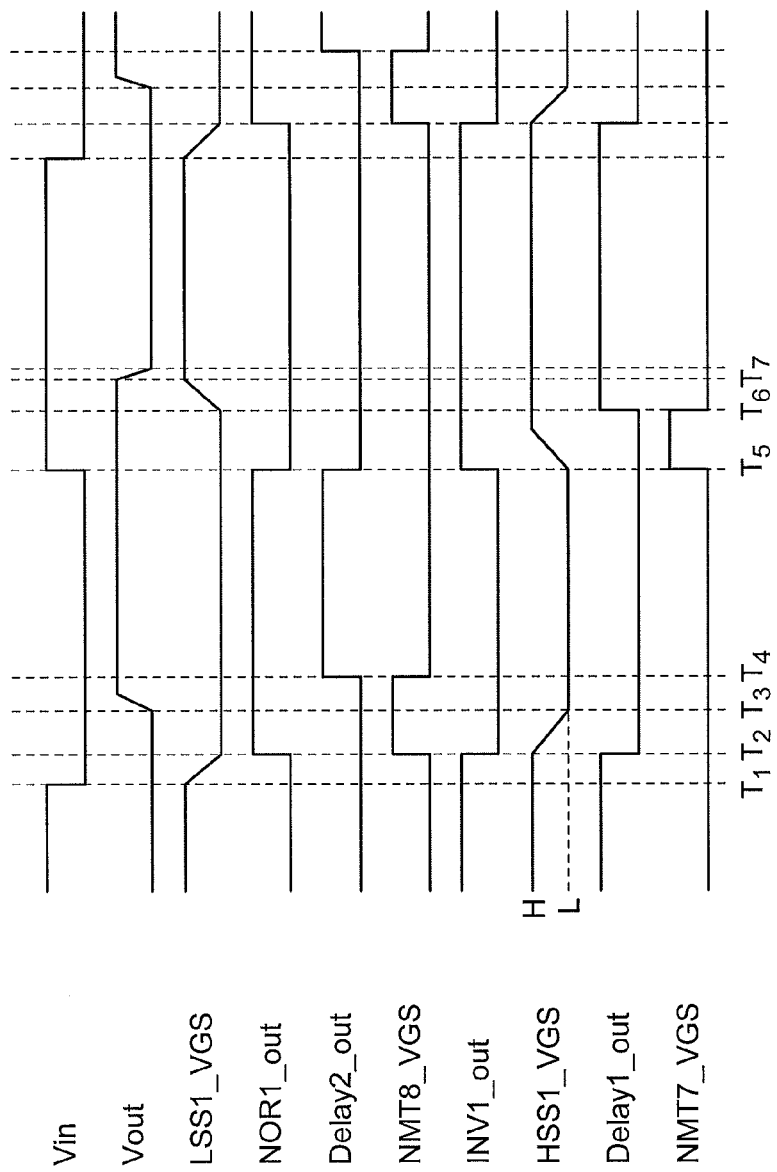
FIG. 2 is an example of a timing chart illustrating the operation of the driver circuit shown in FIG. 1.

The operation of the level shift circuit 100 according to the present embodiment is described with reference to a timing chart in FIG. 2.

First, at a time T1, if the input voltage Vin changes to low (L) from high (H), the output of the AND circuit AND1 changes to low (L) from high (H), so that an output BUFF1_out of the buffer BUFF1 also changes to low (L) from high (H). The output BUFF1_out is a drive voltage of the low-side switching element LSS1, so that if a gate-source voltage LSS1_VGS of the low-side switching element LSS1 decreases and becomes low (L) at a time T2, the low-side switching element LSS1 turns off.

The output voltage BUFF1_out of the buffer BUFF1 is inputted to the other input terminal of the NOR circuit NOR1 via the node N3. Therefore, at the time T2 at which the low-side switching element LSS1 turns off, the output signal NOR1_out of the NOR circuit NOR1 is inverted to high (H) from low (L), and the Nch MIS transistor NMT2 turn on accordingly.

As a result, the Zener diode D3, the Nch MIS transistor NMT4, the Nch MIS transistor NMT2, and the constant current source 11 are conducted so that the HSS1 drive current I2 runs to the low-potential side power supply (ground potential) Vss from the gate of the high-side switching element HSS1. Consequently, the voltage of the node N21 is inverted to low (L) from high (H), and a gate-source voltage HSS1_VGS of the high-side switching element HSS1 starts to decrease to low (L) from high (H).

Furthermore, the output of the NOR circuit NOR1 is inverted to high (H) from low (L) at the time T2, so that the output of the AND circuit AND12 is inverted to high (H) from low (L), and the pulse signal generating circuit 42 outputs a pulse signal tw2.

A gate-source voltage NMT8_VGS of the Nch MIS transistor NMT8 is inverted to high (H) from low (L) simultaneously with the input of the pulse signal tw2 so that the Nch MIS transistor NMT8 turns on simultaneously with the turning on of the Nch MIS transistor NMT2, and a drain current ID (NMT8) runs. Thus, the HSS1 drive current I2 increases by the drain current ID (NMT8), and becomes $$I2=I11+ID(NMT8).$$

Here, the magnitude of the drain current ID (NMT8) is determined by the element sizes of the Nch MIS transistor NMT4 and the Nch MIS transistor NMT8. Therefore, the HSS1 drive current I2 can be significantly increased by setting the element sizes of the Nch MIS transistors NMT4 and NMT8 so that $$I11 \ll ID(NMT8).$$

If the on-time switching time of the high-side switching element HSS1 is ton (HSS1), its value is approximated as is defined in the following expression:

$$ton(HSS1) \approx \text{input capacitance } Ciss(HSS1) \times VD3/I2$$

Therefore, by properly setting the value of the drain current ID (NMT8), it is possible to directly turn on the high-side switching element HSS1 at high speed without using any buffer circuit.

The output INV1_out of the inverter INV1 is inverted to low (L) from high (H) immediately after the time T2. As a result, the Nch MIS transistor NMT1 turns off.

If the gate-source voltage HSS1_VGS of the high-side switching element HSS1 decreases to the low (L) level in a short time from the time T2 to a time T3 by the HSS1 drive current I2 which has been increased by the drain current ID (NMT8), the high-side switching element HSS1 turns on at the time T3.

An output H (high) of the NOR circuit NOR1 at the time T2 is then inputted to the delay circuit Delay2. The output of the delay circuit Delay2 changes to high (H) from low (L) at a time T4. Consequently, the output of the pulse signal tw2 from the pulse signal generating circuit 42 stops. The Nch MIS transistor NMT8 turns off because its gate-source voltage NMT8_VGS is inverted to low (L) from high (H). Therefore, the value of the HSS1 drive current I2 decreases to the value of the electric current I11 by the constant current source 11.

Thus, in the present embodiment, the output period of the pulse signal tw2 is set in such a manner that the Nch MIS transistor NMT8 turns on in accordance with the timing of the switching of the high-side switching element HSS1 to on from off. In the timing chart in FIG. 2, the gate-source voltage NMT8_VGS of the Nch MIS transistor NMT8 becomes high (H) in accordance with the timing of the switching of the gate-source voltage HSS1_VGS of the high-side switching element HSS1 to low (L) from high (H).

Therefore, the pulse signal tw2 for increasing the HSS1 drive current I2 is outputted in a period necessary for the switching of the high-side switching element HSS1, so that power consumption at the time of turning on of the Nch MIS transistor NMT8 is tw2/OT in an operating cycle OT of the high-side switching element HSS1 and can be significantly reduced in comparison with the case where the drain current ID (NMT8) is always biased.

Thus, the value of the HSS1 drive current I2 is high while the high-side switching element HSS1 is being switched from off to on, and the value of the HSS1 drive current I2 decreases to the value of the electric current I11 by the constant current source 11 after the high-side switching element HSS1 has turned on. Therefore, the level shift circuit 100 according to the present embodiment is capable of directly switching on the high-side switching element HSS1 at high speed and reducing power consumption.

If the input voltage Vin then changes to high (H) from low (L) at a time T5, the output of the NOR circuit NOR1 is inverted to low (L) from high (H). Thus, the Nch MIS transistor NMT2 turns off, whereas the output of the inverter INV1 is inverted to high (H) from low (L), and the Nch MIS transistor NMT1 turns on.

As a result, the Zener diode D2, the Nch MIS transistor NMT3, the Nch MIS transistor NMT1, and the constant current source 11 are conducted. Thus, the potential of the node N14 is inverted to low (L) from high (H), the Pch MIS transistor PMT6 turns on, and a drive current (hereinafter referred to as an "PMT6 drive current") I1 of the off-switch Pch MIS transistor PMT6 for turning off the high-side switching element HSS1 runs to the low-potential side power supply (ground potential) Vss from the gate of the Pch MIS transistor PMT6.

At the same time, the output of the AND circuit AND11 is inverted to high (H) from low (L) because an output voltage Delay1_out of the delay circuit Delay1 is still low (L) at the time T5. That is, the pulse signal generating circuit 41 operates, and then the pulse signal tw1 is outputted.

The Nch MIS transistor NMT7 receives the pulse signal tw1 at its gate and thereby turns on simultaneously with the turning on of the Nch MIS transistor NMT1, and passes the drain current ID (NMT7). Thus, the PMT6 drive current I1 increases by the drain current ID (NMT7), and becomes $$I1 = I11 + ID(NMT7).$$

Here, the magnitude of the drain current ID (NMT7) is determined by the element sizes of the Nch MIS transistor NMT3 and the Nch MIS transistor NMT7. Therefore, the PMT6 drive current I1 can be significantly increased by setting the element sizes of the transistors NMT3 and NMT7 so that $$I11 << ID(NMT7).$$

Thus, in comparison with the case in which the Nch MIS transistor NMT7 is not used, the Pch MIS transistor PMT6 is driven at high speed so that the high-side switching element HSS1 can be turned off before a time T6.

At the time T6 after the high-side switching element HSS1 has certainly turned off, the output Delay1_out of the delay circuit Delay1 is inverted to high (H) from low (L), and the output of the AND circuit AND1 is then inverted to high (H) from low (L). Accordingly, the gate-source voltage LSS1_VGS of the low-side switching element LSS1 starts to rise, and the low-side switching element LSS1 turns on at a time T7.

Thus, according to the present embodiment, the drive current of the Pch MIS transistor PMT6 is increased by the AND circuit AND11 which outputs the pulse signal tw1, so that the high-side switching element HSS1 can be rapidly switched off. Moreover, without the use of any off-detection circuit having a large circuit scale/size in particular, the low-side switching element LSS1 can turn on after the high-side switching element HSS1 has certainly turned off. That is, the turn-on time of the low-side switching element LSS1 is delayed by the output signal of the delay circuit Delay1. A dead time (a time from the start of the fall of the gate-source voltage HSS1_VGS of the high-side switching element HSS1 to low (L) from high (H) as a result of the output of high (H) from the inverter INV to the start of the rise of the gate-source voltage LSS1_VGS of the low-side switching element LSS1) is provided, and it is therefore possible to prevent a flow-through current from flowing between the high-side switching element HSS1 and the low-side switching element LSS1.

(2) Embodiment 2

Figure 3:
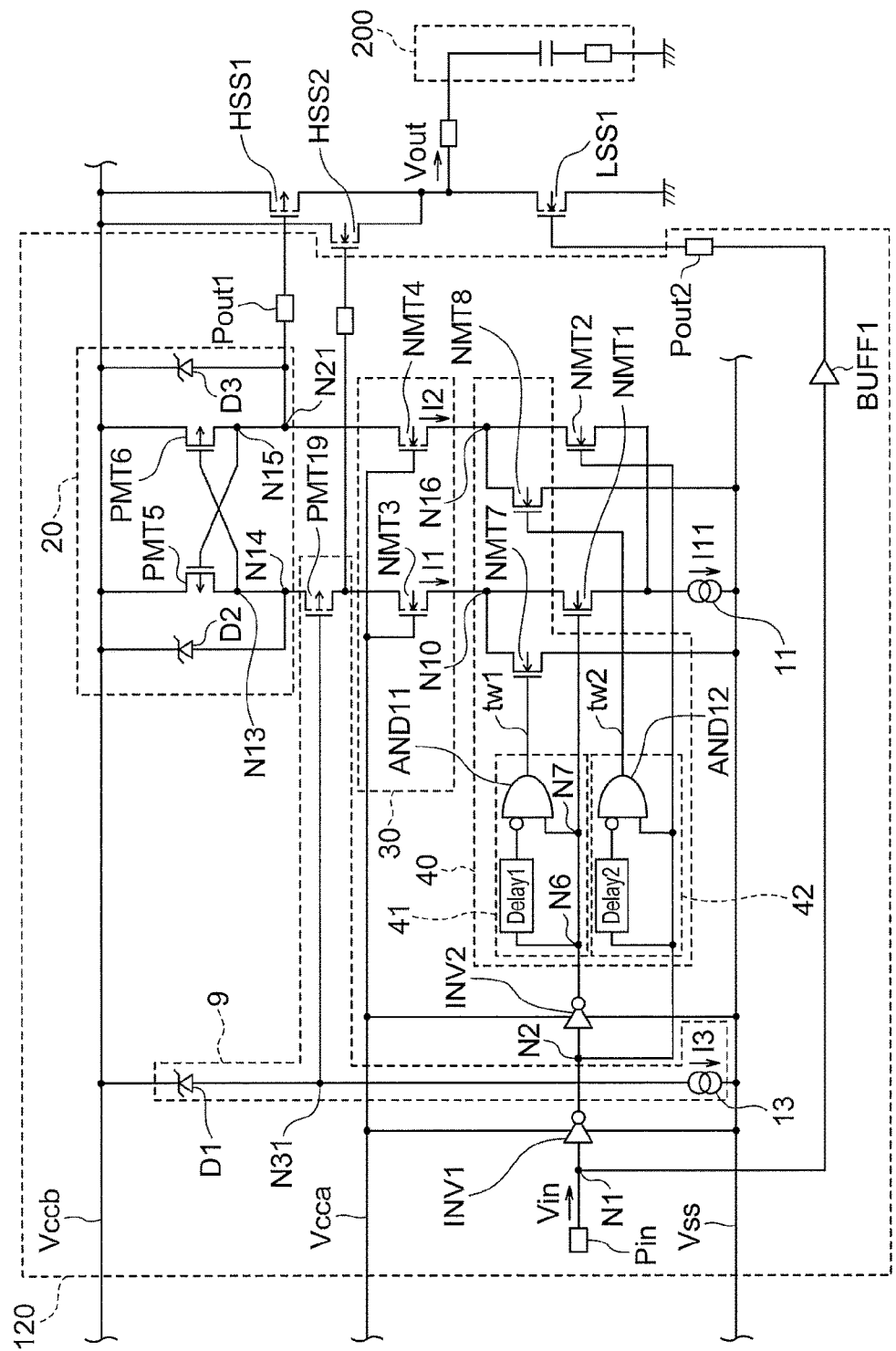
FIG. 3 is an example of a circuit diagram showing a schematic configuration of a driver circuit according to Embodiment 2.

FIG. 3 is an example of a circuit diagram showing a schematic configuration of an output switching element drive circuit which includes a level shift circuit 120 according to Embodiment 2.

As apparent from the contrast with FIG. 1, the output switching element drive circuit according to the present embodiment further includes a high-side switching element HSS2 which is an Nch MIS transistor, and also includes the level shift circuit 120 having a drive circuit 9 of the high-side switching element HSS2 instead of the level shift circuit 100 in FIG. 1. The high-side switching element HSS2 corresponds to, for example, the seventh transistor in the present embodiment. The drive circuit 9 corresponds to, for example, a first circuit in the present embodiment, and is composed of a Pch MIS transistor PMT19, a Zener diode D1, and a constant current source 13. The configuration of the output switching element drive circuit according to the present embodiment is substantially the same as the output switching element drive circuit shown in FIG. 1 in other respects.

The high-side switching element HSS2 has its drain connected to the high-potential side power supply Vccb, its source connected to the output terminal Vout, and its gate connected to the source/drain of the Pch MIS transistor PMT19 so that the high-side switching element HSS2 is connected in parallel to the high-side switching element HSS1. The Pch MIS transistor PMT19 has its source connected to the node N14, its drain connected to the drain of the Nch MIS transistor NMT3, and its gate connected to the anode of the Zener diode D1 via a node N31 so that the Pch MIS transistor PMT19 is connected in cascade to the Pch MIS transistor PMT5. The Zener diode D1 has a breakdown voltage less than or equal to the gate breakdown voltage of the high-side switching element HSS2, for example, a breakdown voltage of 5 V, and has its cathode connected to the high-potential side power supply Vccb and its anode connected to the constant current source 13 via the node N31. The constant current source 13 has one end connected to the node N31 and the other end connected to the low-potential side power supply (ground potential) Vss.

If the input voltage Vin changes to low (L) from high (H), the low-side switching element LSS1 turns off. The output voltage of the inverter INV1 changes to high (H) from low (L), so that the Nch MIS transistor NMT2 turns on, and the Nch MIS transistor NMT4 also turns on. As a result, the HSS1 drive current I2 runs to the low-potential side power supply (ground potential) Vss of from the gate of the high-side switching element HSS1. Thus, the voltage of the node N21 is inverted to low (L) from high (H), and the gate-source voltage HSS1_VGS of the high-side switching element HSS1 starts to decrease to low (L) from high (H).

The pulse signal generating circuit 42 then outputs the pulse signal tw2, the gate-source voltage NMT8_VGS of the Nch MIS transistor NMT8 is inverted to high (H) from low (L), and the Nch MIS transistor NMT8 thus turns on, so that the drain current ID (NMT8) runs. Thus, the HSS1 drive current I2 increases by the drain current ID (NMT8), and becomes $$I2 = I11 + ID(NMT8).$$

As in Embodiment 1 above, the element sizes of the Nch MIS transistor NMT4 and the Nch MIS transistor NMT8 are properly set, and it is thereby possible to directly turn on the high-side switching element HSS1 at high speed without using any buffer circuit by properly setting the value of the drain current ID (NMT8) so that $$I11 << ID(NMT8).$$

The voltage of the node N21 is inverted to low (L) from high (H), and the Pch MIS transistor PMT5 turns on accordingly. At the same time, the Pch MIS transistor PMT19 which is connected in cascade to the Pch MIS transistor PMT5 also turns on, and rapidly turns on the high-side switching element HSS2.

If the input voltage Vin changes to high (H) from low (L), the output voltage of the inverter INV1 changes to low (L) from high (H), and the Nch MIS transistor NMT2 turns off. On the other hand, the output of an inverter INV2 changes to high (H) from low (L), so that the Nch MIS transistor NMT1 turns on.

Along with the turning on of the Nch MIS transistor NMT1, the Nch MIS transistors NMT3 and NMT19 also turn on. As a result, the Pch MIS transistor PMT5, the Pch MIS transistor PMT19, the Nch MIS transistors NMT3 and NMT1, and the constant current source 11 are conducted, the potential of the node N14 is inverted to low (L) from high (H), the Pch MIS transistor PMT6 turns on, and the PMT6 drive current I1 for turning off the high-side switching element HSS1 runs to the low-potential side power supply (ground potential) Vss from the gate of the Pch MIS transistor PMT6.

The pulse signal tw1 is then outputted from the pulse signal generating circuit 41, a gate-source voltage NMT7_VGS of the Nch MIS transistor NMT7 is inverted to high (H) from low (L), and the Nch MIS transistor NMT7 thus turns on, so that the drain current ID (NMT7) runs. Thus, the PMT6 drive current I1 increases by the drain current ID (NMT7), and becomes $$I1 = I11 + ID(NMT7).$$

As in Embodiment 1 above, the element sizes of the Nch MIS transistor NMT3 and the Nch MIS transistor NMT7 are properly selected, and it is thereby possible to rapidly drive the Pch MIS transistor PMT6 and then turn off the high-side switching element HSS1 before the time T6, in comparison with the case in which the Nch MIS transistor NMT7 is not used, by properly setting the value of the drain current ID (NMT7) so that $$I11 << ID(NMT7).$$

Because the Pch MIS transistor PMT5 and the Nch MIS transistor NMT7 turn on, the gate voltage of the high-side switching element HSS2 rapidly decreases, and the high-side switching element HSS2 turns off accordingly.

According to the present embodiment, the gate of the high-side switching element HSS2 is connected to the drain of the Pch MIS transistor PMT19 which has its gate connected to the anode of the Zener diode D1 and which is connected in cascade to the Pch MIS transistor PMT5, so that it is possible to obtain potential amplitude over the whole voltage from the low-potential side power supply (ground potential) Vss to the high-potential side power supply Vccb. Thus, the high-side switching elements HSS1 and HSS2 connected in parallel can be directly driven with a simple configuration.

(3) Embodiment 3

In the output switching element drive circuit according to Embodiment 1, the Pch MIS transistor PMT6 keeps the on-state so that the gate potential of the high-side switching element HSS1 is the same as the high-potential side power supply Vccb (a truth value=H of the gate-source voltage HSS1_VGS) while the high-side switching element HSS1 is off.

Figure 4:
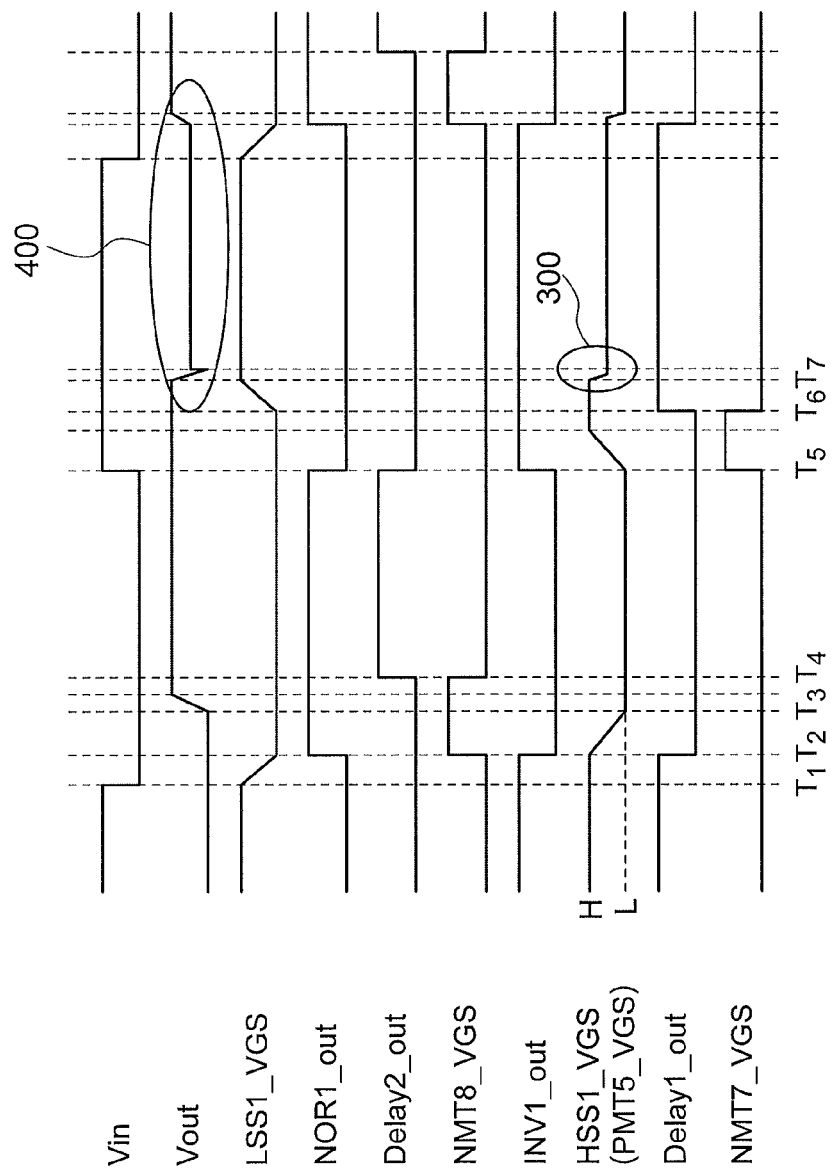
FIG. 4 is an example of a timing chart illustrating one aspect of a wrong operation of the driver circuit shown in FIG. 1.

However, a voltage in a negative direction compared to the voltage of the high-potential side power supply Vccb may be applied to the drain side of the high-side switching element HSS1 from an external element such as the load 200, and a feedback capacitance Crss of the high-side switching element HSS1 may be released, so that the gate potential of the high-side switching element HSS1 may be drawn toward the low-potential side power supply (ground potential) Vss as indicated by the sign 300 in the timing chart in FIG. 4.

According to the output switching element drive circuit in Embodiment 1, the high-side switching element HSS1 is directly driven by the output of the level shift circuit 100 without the intervention of any buffer circuit. If the gate potential of the high-side switching element HSS1 is drawn toward the negative side and exceeds the threshold of the Pch MIS transistor PMT5 and then applied to the gate of the Pch MIS transistor PMT5, the Pch MIS transistor PMT5 may turn on.

If the Pch MIS transistor PMT5 turns on, a potential which is substantially the same as the high-potential side power supply Vccb is applied to the gate of the Pch MIS transistor PMT6, so that the Pch MIS transistor PMT6 turns off. Consequently, the high-side switching element HSS1 cannot be kept off, and there is no path through which the feedback capacitance Crss of the high-side switching element HSS1 is pulled out, so that the high-side switching element HSS1 maintains the on-state.

At this point, as indicated by the sign 400 in the timing chart in FIG. 4, the high-side switching element HSS1 and the low-side switching element LSS1 substantially simultaneously turn on, and an excessive flow-through current then flows, so that the circuit apparatus may be significantly damaged.

The present embodiment provides a circuit configuration to which an element to inhibit the above-mentioned wrong operation is added.

Figure 5:
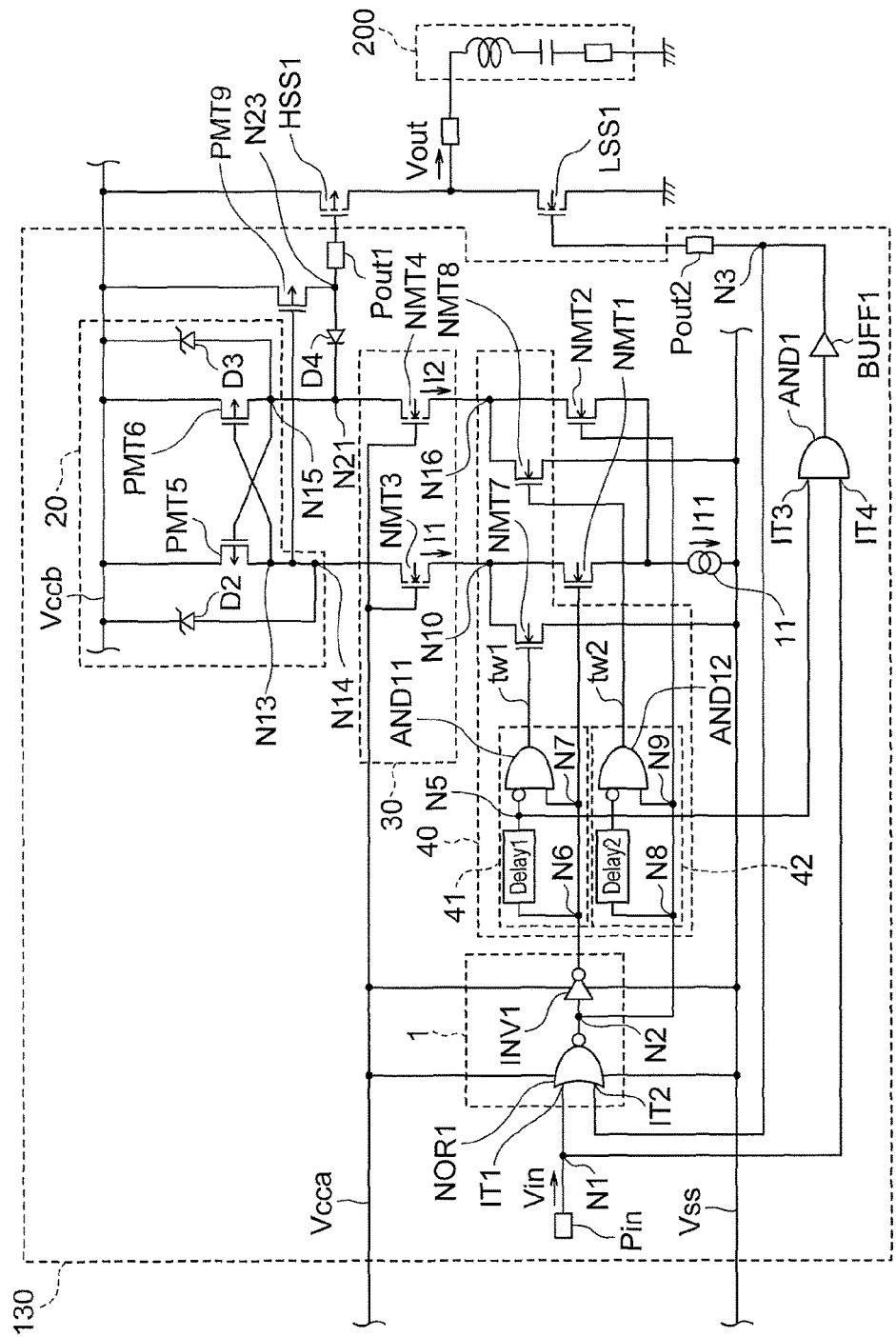
FIG. 5 is an example of a circuit diagram showing a schematic configuration of a driver circuit according to Embodiment 3.
Figure 6:
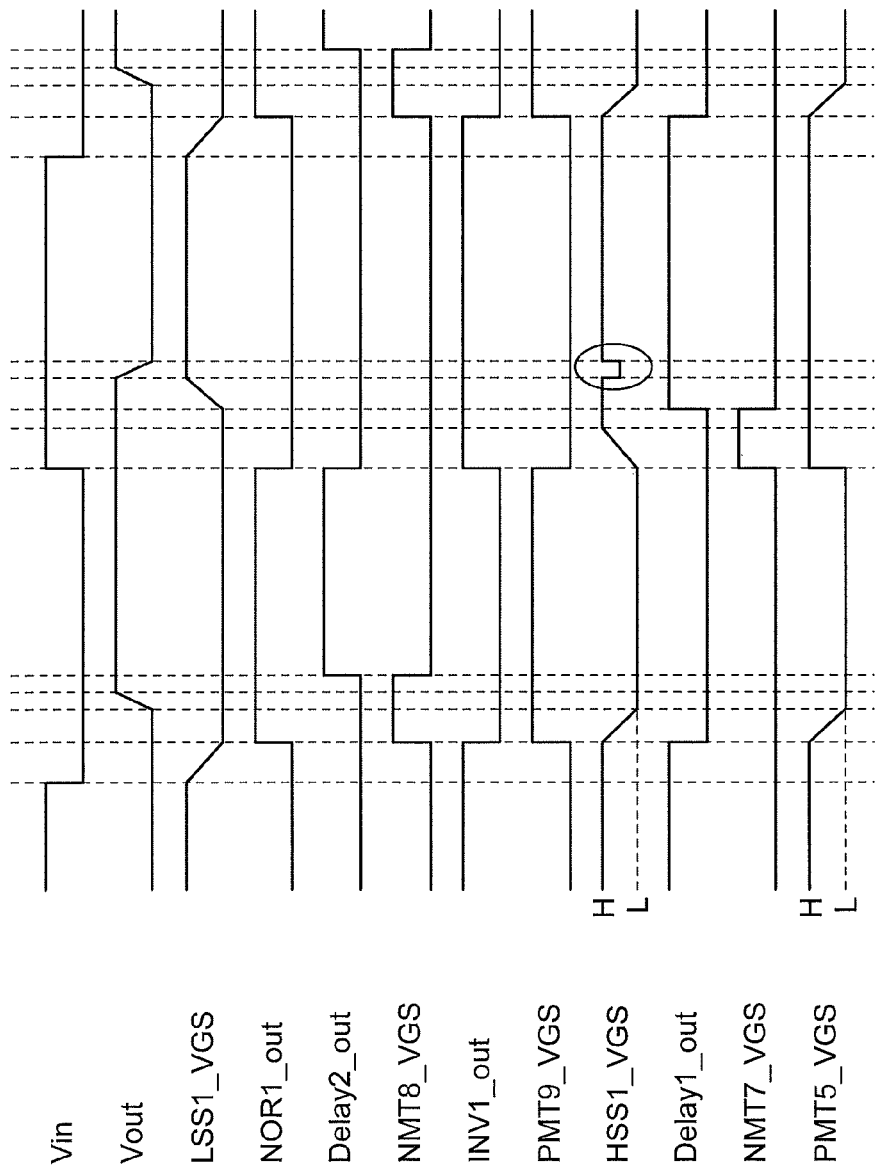
FIG. 6 is an example of a timing chart illustrating the operation of the driver circuit shown in FIG. 5.

FIG. 5 is an example of a circuit diagram showing a schematic configuration of an output switching element drive circuit which includes a level shift circuit 130 according to Embodiment 3. FIG. 6 is an example of a timing chart illustrating the operation of the level shift circuit shown in FIG. 5.

As shown in FIG. 5, the output switching element drive circuit according to the present embodiment includes the level shift circuit 130 to which a Pch MIS transistor PMT9 and a diode D4 are added, in addition to the configuration of the level shift circuit 100 shown in FIG. 1. The Pch MIS transistor PMT9 functions as an off-switch for the high-side switching element HSS1. The diode D4 electrically disconnects the node N21 and the gate of the high-side switching element HSS1 from each other when the high-side switching element HSS1 turns off.

The diode D4 has its cathode connected to the node N21 and its anode connected to the gate of the high-side switching element HSS1.

The Pch MIS transistor PMT9 has its source connected to the high-potential side power supply Vccb, its drain connected to the gate of the high-side switching element HSS1 via a node N23, and its gate connected to the drain of the Pch MIS transistor PMT5.

The HSS1 drive current I2 is inputted to the high-side switching element HSS1 from the level shift circuit 130 via the diode D4 when the high-side switching element HSS1 is on, and the high-side switching element HSS1 is thus driven. As has been described above in Embodiment 1, the drive current I2 in this case is $$I2 = I11 + ID(NMT8),$$

and in the present embodiment, the on-time switching time ton(HSS1) of the high-side switching element HSS1 approximates:

$$ton(HSS1) \approx \text{input capacitance } Ciss(HSS1) \times (VD3 - VF4)/I2.$$

Therefore, by properly setting the value of the drain current ID (NMT8), it is possible to directly turn on the high-side switching element HSS1 at high speed without using any buffer circuit, as in Embodiment 1 above.

In contrast, in the present embodiment, the diode D4 and the Pch MIS transistor PMT9 are provided, so that the gate of the high-side switching element HSS1 and the gate of the Pch MIS transistor PMT5 are electrically disconnected from each other when the high-side switching element HSS1 is off. Therefore, the gate-source voltage HSS1_VGS of the high-side switching element HSS1 which has temporarily decreased because of noise from a connection-destination external element is not applied to the gate of the Pch MIS transistor PMT5. Thus, the output switching element can stably operate.

A forward diode may be added between the anode of the Zener diode D3 and the cathode of the diode D4, in addition to the configuration shown in FIG. 5. Thus, a gate drive voltage VGS_HSS1 of the high-side switching element HSS1 certainly approximates the voltage VD3 of the Zener diode D3, and the on-resistance of the high-side switching element HSS1 improves. An off-switch or a resistance may be used instead of the diode D4.

(4) Embodiment 4

Figure 7:
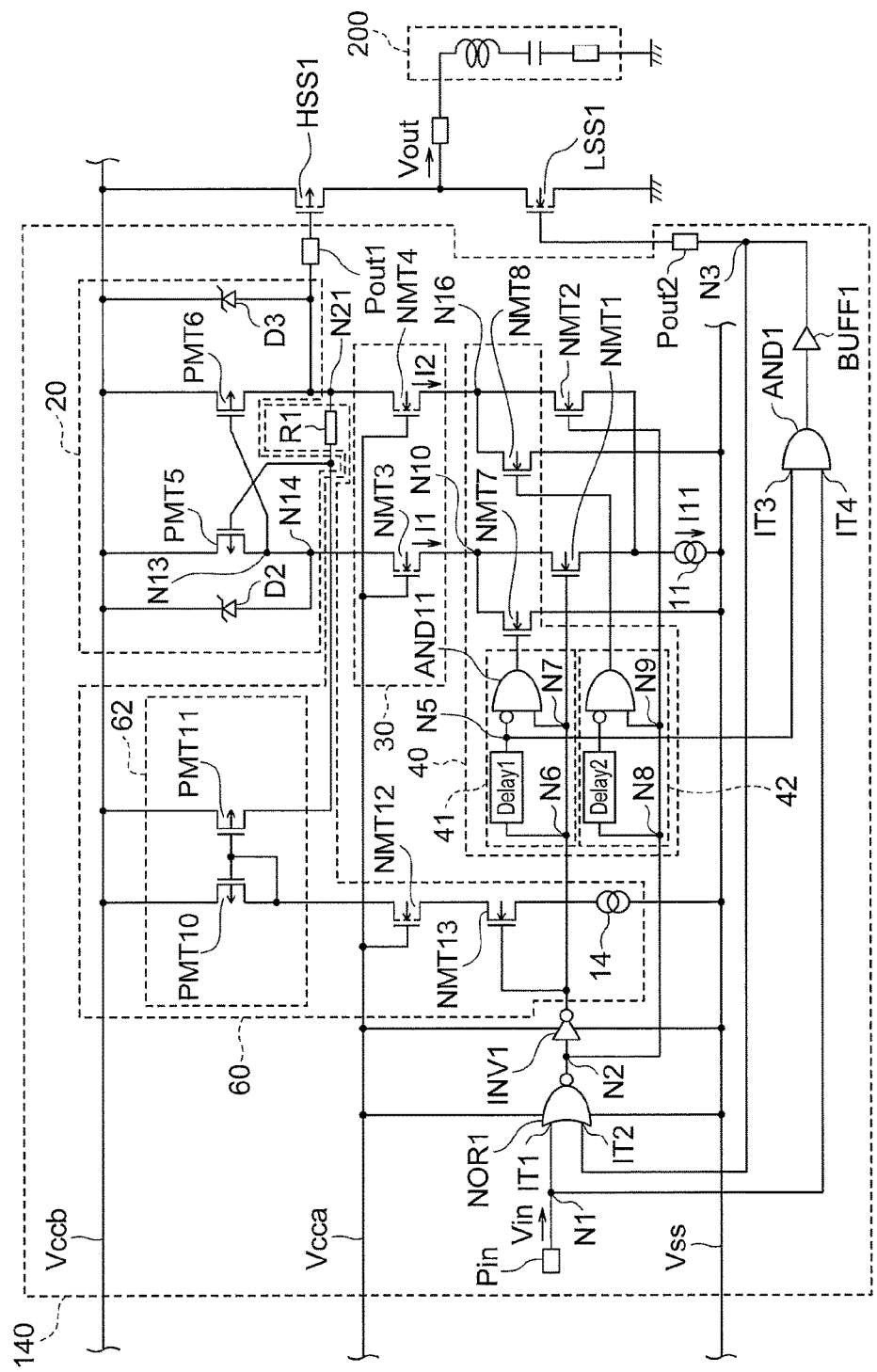
FIG. 7 is an example of a circuit diagram showing a schematic configuration of a driver circuit according to Embodiment 4.

FIG. 7 is an example of a circuit diagram showing a schematic configuration of an output switching element drive circuit which includes a level shift circuit 140 according to Embodiment 4. In addition to the circuit configuration shown in FIG. 1, the output switching element drive circuit according to the present embodiment further includes an inversion prevention circuit 60 which prevents the inversion of the high-side output while the high-side switching element HSS1 is off. The configuration of the output switching element drive circuit according to the present embodiment is substantially the same as the circuit shown in FIG. 1 in other respects.

The inversion prevention circuit 60 corresponds to, for example, a second circuit in the present embodiment, and includes a resistance R1, a current mirror circuit 62, Nch MIS transistors NMT12 and NMT13, and a constant current source 14.

The current mirror circuit 62 includes Pch MIS transistors PMT10 and PMT11. The Pch MIS transistors PMT10 and PMT11 have their sources both connected to the high-potential side power supply Vccb and their gates both connected to the drain of the Pch MIS transistor PMT10.

The resistance R1 has one end connected to the node N21 and the other end connected to the gate of the Pch MIS transistor PMT5, and is connected to the drain of the Pch MIS transistor PMT11.

The Nch MIS transistors NMT12 and NMT13 are connected in cascade to the Pch MIS transistor PMT10. That is, the Nch MIS transistor NMT12 has its drain connected to the drain of the Pch MIS transistor PMT10, its gate connected to the high-potential side power supply Vcca, and its source connected to the drain of the Nch MIS transistor NMT13. The gate of the Nch MIS transistor NMT13 is connected to the output terminal of the inverter INV1, and the source of the Nch MIS transistor NMT13 is connected to one end of the constant current source 14. The other end of the constant current source 14 is connected to the low-potential side power supply (ground potential) Vss.

If the input voltage Vin changes to high (H) from low (L) and the output of the inverter INV1 also changes to high (H) from low (L), the Nch MIS transistor NMT13 turn on, the Pch MIS transistor PMT10, the Nch MIS transistors NMT12 and NMT13, and the constant current source 14 are conducted, and an electric current I4 runs to the low-potential side power supply (ground potential) Vss from the high-potential side power supply Vccb. At this point, an electric current ID (PMT11) corresponding to a current ratio runs to the resistance R1 from the drain of the Pch MIS transistor PMT11.

PMT5_VGS can be represented by $$PMT5\_VGS = HSS1\_VGS - R1 \times ID(PMT11)$$

wherein R1 is the resistance value of the resistance R1, and PMT5_VGS is a gate-source voltage of the Pch MIS transistor PMT5.

Figure 8:
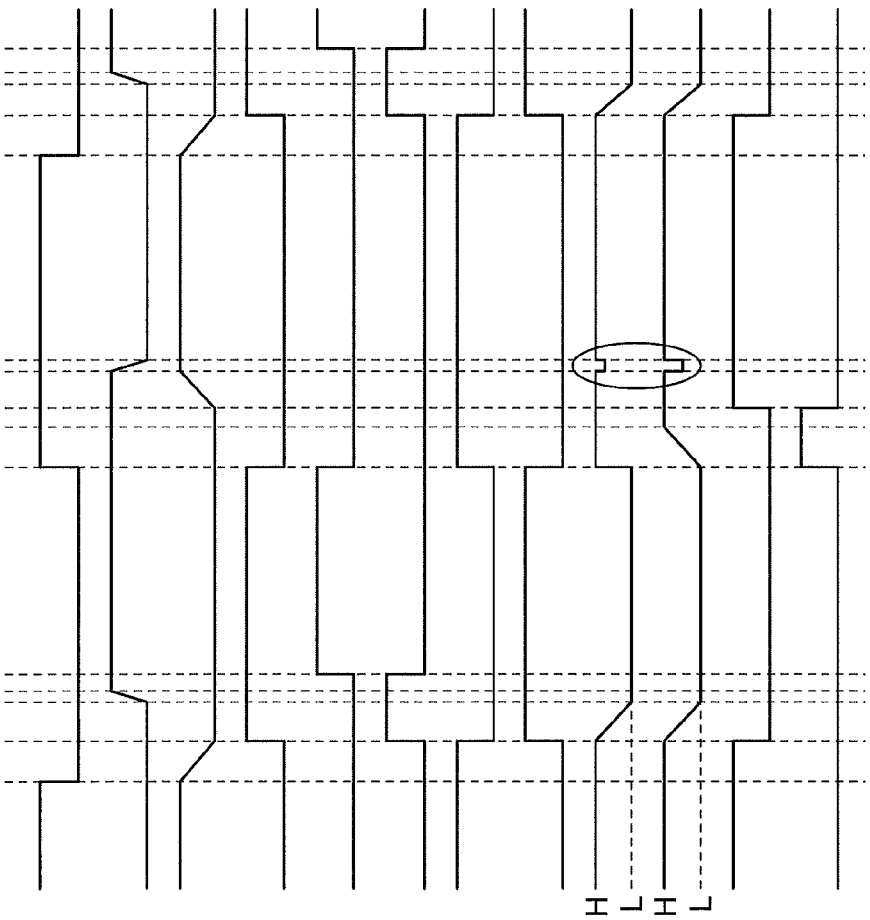
FIG. 8 is an example of a timing chart illustrating the operation of the driver circuit shown in FIG. 7.

If the threshold voltage of the Pch MIS transistor PMT5 is PMT5_Vth, it is possible to prevent the inversion of the high-side output of the level shift circuit 140 as shown in the timing chart in FIG. 8 by setting R1 and ID (PMT11) to any values for HSS1_VGS to be expected so that the following expression is satisfied:

$$PMT5\_Vth > HSS1\_VGS - R1 \times ID(PMT11).$$

Although the value of the drain current ID (PMT11) of the Pch MIS transistor PMT11 is set by the current mirror circuit 62 in the example described in the mode shown in FIG. 7, the configuration is not limited to this. Various alternative configurations can be used.

Figure 9:
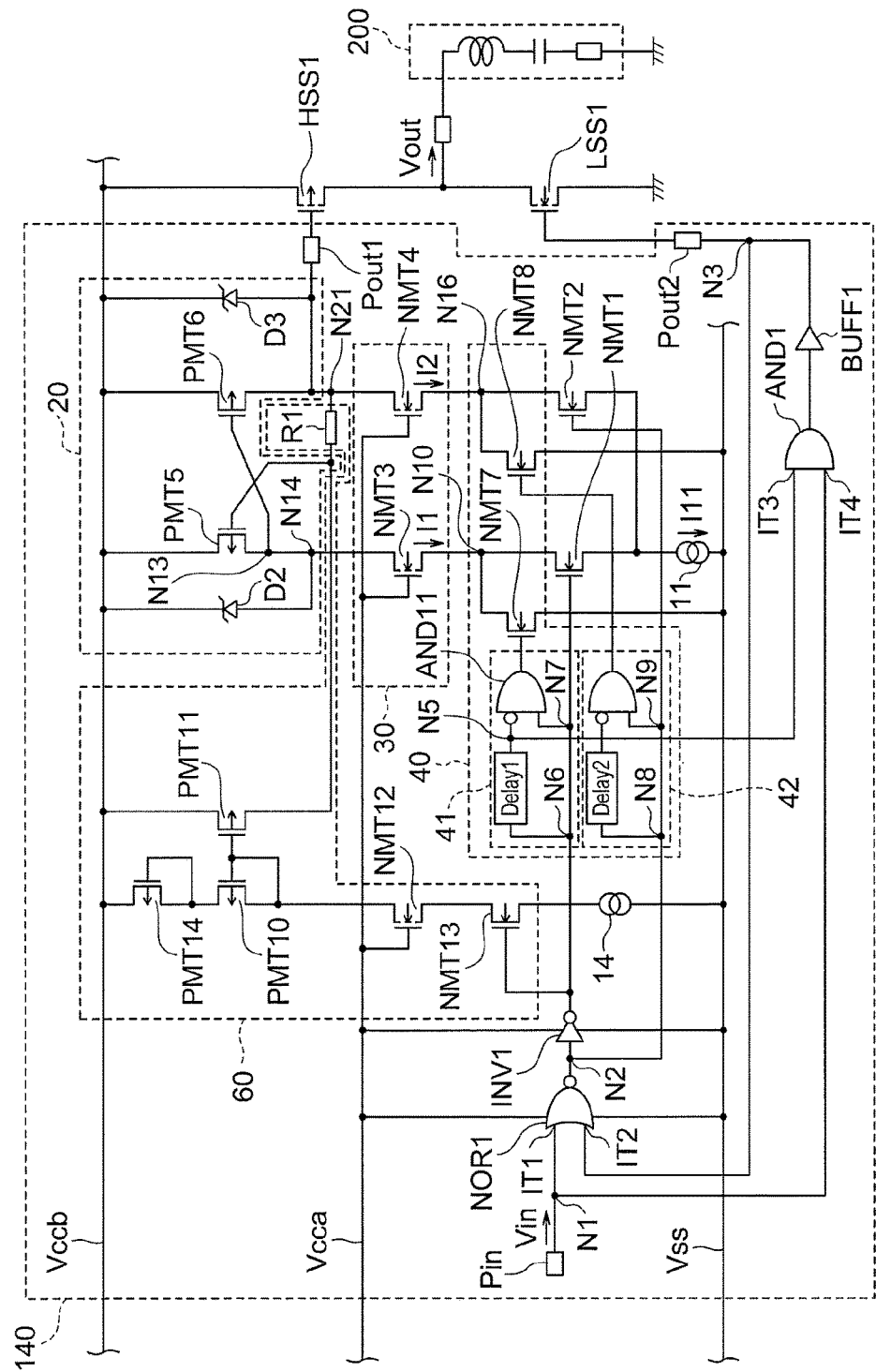
FIG. 9 is an example of a circuit diagram showing a schematic configuration of a modification of the driver circuit shown in FIG. 7.

For example, as shown in Modification 1 in FIG. 9, a Pch MIS transistor PMT14 similar to the Pch MIS transistor PMT10 may be inserted between the source of the Pch MIS transistor PMT10 and the high-potential side power supply Vccb in a connection aspect similar to that of the Pch MIS transistor PMT10 to form a multistage configuration.

Figure 10:
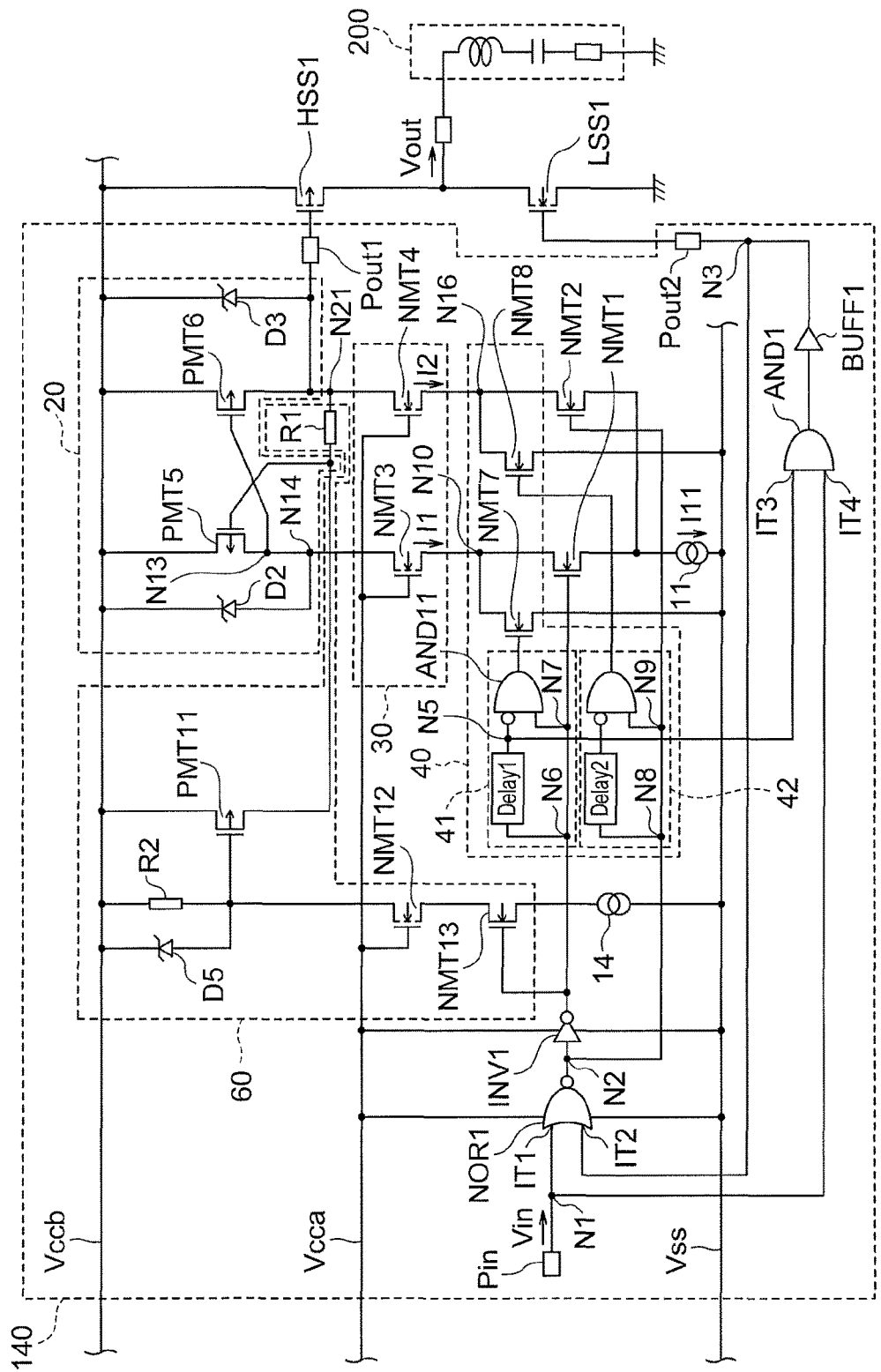
FIG. 10 is an example of a circuit diagram showing a schematic configuration of another modification of the driver circuit shown in FIG. 7.

For example, as shown in Modification 2 in FIG. 10, the Pch MIS transistor PMT11 is may be switched by use of a Zener diode D5 and a resistance R2 and used instead of the Pch MIS transistor PMT10, and its on-resistance Ron (PMT11) may be used. In this case, the gate of the Pch MIS transistor PMT11 is connected to one end of the resistance R2 via the node N31, and also connected to the anode of the Zener diode D5 via the node N31. Both the other end of the resistance R2 and the cathode of the Zener diode D5 are connected to the high-potential side power supply Vccb.

According to the present embodiment, the inversion prevention circuit 60 prevents the high-side output Vout from being inverted when the high-side switching element HSS1 is off, so that the output switching element can more stably operate.

The level shift circuit according to at least one of the embodiments described above has the pulse signal generating circuit 42 which generates the pulse signal tw2, and the Nch MIS transistor NMT8 which is turned on by the pulse signal tw2 and then increases the HSS1 drive current I2, so that it is possible to directly turn on the high-side switching element HSS1 at high speed without using any buffer circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A level shift circuit comprising:
a control circuit configured to output a first voltage obtained by level-shifting an input voltage to a first terminal;
a first transistor supplying a first electric current to the control circuit for outputting the first voltage to the first terminal;
a second transistor increasing the first electric current;
a first generating circuit configured to generate a first pulse signal for controlling the second transistor;
a third transistor supplying a second electric current to the first terminal for generating a second voltage corresponding to a first power supply of a low-potential side;
a fourth transistor increasing the second electric current; and
a second generating circuit configured to generate a second pulse signal for controlling the fourth transistor wherein the second transistor is connected to the first transistor in series.

2. The circuit of claim 1,
wherein the first generating circuit is configured to output the first pulse signal in response to a change in the first terminal from the second voltage to the first voltage.

3. The circuit of claim 2,
wherein the second transistor comprises a control terminal inputting the first pulse signal.

4. The circuit of claim 1,
wherein the first generating circuit comprises a first delay circuit outputting a first signal delaying the input signal and outputting the first pulse signal based on an input signal and the first signal.

5. The circuit of claim 1,
wherein the control circuit comprises a fifth transistor outputting the first voltage to the first terminal, and
wherein the first transistor supplies the first electric current to a controlling terminal of the fifth transistor.

6. The circuit of claim 1,
wherein the second generating circuit is configured to output the second pulse signal in response to a change in the first terminal from the first voltage to the second voltage.

7. The circuit of claim 6,
wherein the fourth transistor comprises a control terminal inputting the second pulse signal.

8. The circuit of claim 6,
wherein the fourth transistor is connected to the third transistor in series.

9. The circuit of claim 1,
wherein the second generating circuit comprises a second delay circuit outputting a second signal that an inverted signal of an input signal is delaying, and
wherein the second pulse signal is outputted based on the input signal and the second signal.

10. The circuit of claim 1, further comprising:
a first circuit outputting a voltage in association with an inverted output of an output from the first terminal, to a second terminal under the control of the control circuit.

11. The circuit of claim 10,
wherein the first circuit comprises:
a fifth transistor between the control circuit and the first transistor;
a zener diode reversely connected between the fifth transistor and a second power supply higher than the first power supply; and
a constant current source between the first power supply and an anode of the zener diode.

12. A driver circuit comprising:
a level shift circuit according to claim 10;
a fifth transistor controlled by an output from the first terminal; and
a sixth transistor connected in parallel to the fifth transistor and comprising a conductivity type reverse to that of the fifth transistor,
wherein the first circuit is configured to drive the sixth transistor.

13. The circuit of claim 1, further comprising:
a first element or a first circuit, either being provided between the first terminal and the control circuit for maintaining the first voltage.

14. The circuit of claim 13,
wherein the first element further comprises a diode in which an anode connects to the first terminal and a cathode connects to an output terminal of the control circuit.

15. The circuit of claim 1, further comprising a second terminal,
wherein the first generating circuit comprises a delay circuit outputting a first signal delaying an input signal and
wherein a third signal based on the input signal and the first signal is outputted to the second terminal.

16. A driver circuit comprising:
a level shift circuit according to claim 15;
a fifth transistor controlled by an output from the first terminal; and
a sixth transistor controlled by an output from the second terminal.

17. A driver circuit comprising:
a level shift circuit according to claim 1; and
a fifth transistor controlled by an output from the level shift circuit.

* * * * *